US009035691B2

(12) United States Patent
Roeper

(10) Patent No.: US 9,035,691 B2

(45) Date of Patent: May 19, 2015

(54) GATE CONTROL CIRCUIT FOR MOS SWITCH

(71) Applicant: Atmel Corporation, San Jose, CA (US)

(72) Inventor: Wolfgang Roeper, Heilbronn (DE)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 14/044,772

(22) Filed: Oct. 2, 2013

(65) Prior Publication Data

US 2015/0091634 A1 Apr. 2, 2015

(51) Int. Cl.

*H03K 17/687* (2006.01)
*H03K 17/30* (2006.01)
*H03K 17/16* (2006.01)

(52) U.S. Cl.

CPC ............ *H03K 17/302* (2013.01); *H03K 17/162* (2013.01); *H03K 17/687* (2013.01); *H03K 2217/0054* (2013.01)

(58) Field of Classification Search

USPC .................................................. 327/427, 434

See application file for complete search history.

(56) References Cited

U.S. PATENT DOCUMENTS 3,558,988 A * 1/1971 Ellenberger .................. 361/102
4,916,378 A * 4/1990 Marchio' et al. ............. 323/222
5,072,627 A * 12/1991 Horiye et al. ....................... 74/6

* cited by examiner

*Primary Examiner* — William Hernandez

(74) *Attorney, Agent, or Firm* — Fish & Richardson P.C.

(57) ABSTRACT

A gate drive circuit is disclosed that charges the gate of a switching transistor to a voltage that is high enough to turn the switching transistor fully on and then prevent the charge from flowing back into the gate drive circuit. The gate drive circuit works with a ground rectifier switch by providing a fully differential connection of the switching transistor and its capacitor and resistor in parallel with the antenna.

8 Claims, 2 Drawing Sheets

GATE CONTROL CIRCUIT FOR MOS SWITCH

TECHNICAL FIELD

This disclosure relates generally to low frequency (LF) receivers for remote keyless entry (RKE) applications.

BACKGROUND

A RKE system is an electronic lock that controls access to a building or vehicle without using a traditional mechanical key. When the driver approaches the building or vehicle, a secure wireless communication between a key fob and a control unit authenticates the key fob. Bi-directional wireless communication authenticates the key fob and the vehicle in both one-way and two-way radio frequency (RF) systems. In one-way RF systems a LF downlink serves to wake up the key fob and to receive commands and data for the authentication process. The key fob then sends the response to the vehicle using a RF uplink. In two-way RF systems the LF downlink only serves to wakeup the key fob and to establish the RF uplink or downlink. The bi-directional RF link handles the communication during the authentication process. Building or vehicle LF antennas (coils) detect the key fob location and determine if the key fob is inside or outside the building or vehicle cabin. The position and the number of antennas can be adapted to any type of building or vehicle.

Localization is an important feature of an RKE system. Localization detects if the key fob is near the building or vehicle and if the key fob is inside or outside the building or vehicle. A car has typically four to six LF antennas. These produce an LF magnetic field covering both the car interior and the car's vicinity. The key fob measures the LF signal level during the communication with the control unit. In some RKE systems, the key fob acquires the received signal strength indication (RSSI) and sends it back to the control unit, which analyzes the RSSI to determine the position of the key fob. As the spatial orientation of the key fob is unknown, the key fob uses three discrete antenna coils or one three-dimensional (3D)-coil to determine the x-, y- and z-axes. The RSSI measurement accuracy depends on the hardware device and on the precise calibration of key fobs during end-of-line manufacturing. In some RKE systems, all three axes are measured simultaneously which reduces the overall RSSI measurement time.

In some RKE systems, the antennas in the key fob are tuned by a drive circuit that is coupled to the antenna (coil) by a MOS switch (e.g., NMOS transistor). The gate of the MOS switch is controlled by a gate drive circuit. A high gate drive voltage is often needed to properly turn on the MOS switch. Because the key fob runs on a low voltage power supply (e.g., a battery), some conventional key fobs use a voltage multiplier (e.g., a charge pump) to generate the high gate drive voltage. Unfortunately, this approach is not feasible in an extremely low power design, because the voltage multiplier needs a significant amount of current to operate.

SUMMARY

A gate drive circuit is disclosed that charges the gate of a switching transistor to a voltage that is high enough to turn the transistor fully on and then prevent the charge from flowing back into the gate drive circuit. The gate drive circuit works with a ground rectifier switch by providing a fully differential connection of the switching transistor and its capacitor and resistor in parallel with the antenna.

Particular implementations of a gate control circuit for MOS switch provides one or more of the following advantages: 1) the gate control circuit can be operated using a low voltage power supply (e.g., 3V lithium battery) without extra current consumption; 2) the gate control circuit allows use of a fully integrated trimming circuit for an external tank circuit of an LF receiver; and 3) the gate control circuit improves the sensitivity of the LF receiver.

DETAILED DESCRIPTION

Example Gate Drive Circuit

Figure 1:
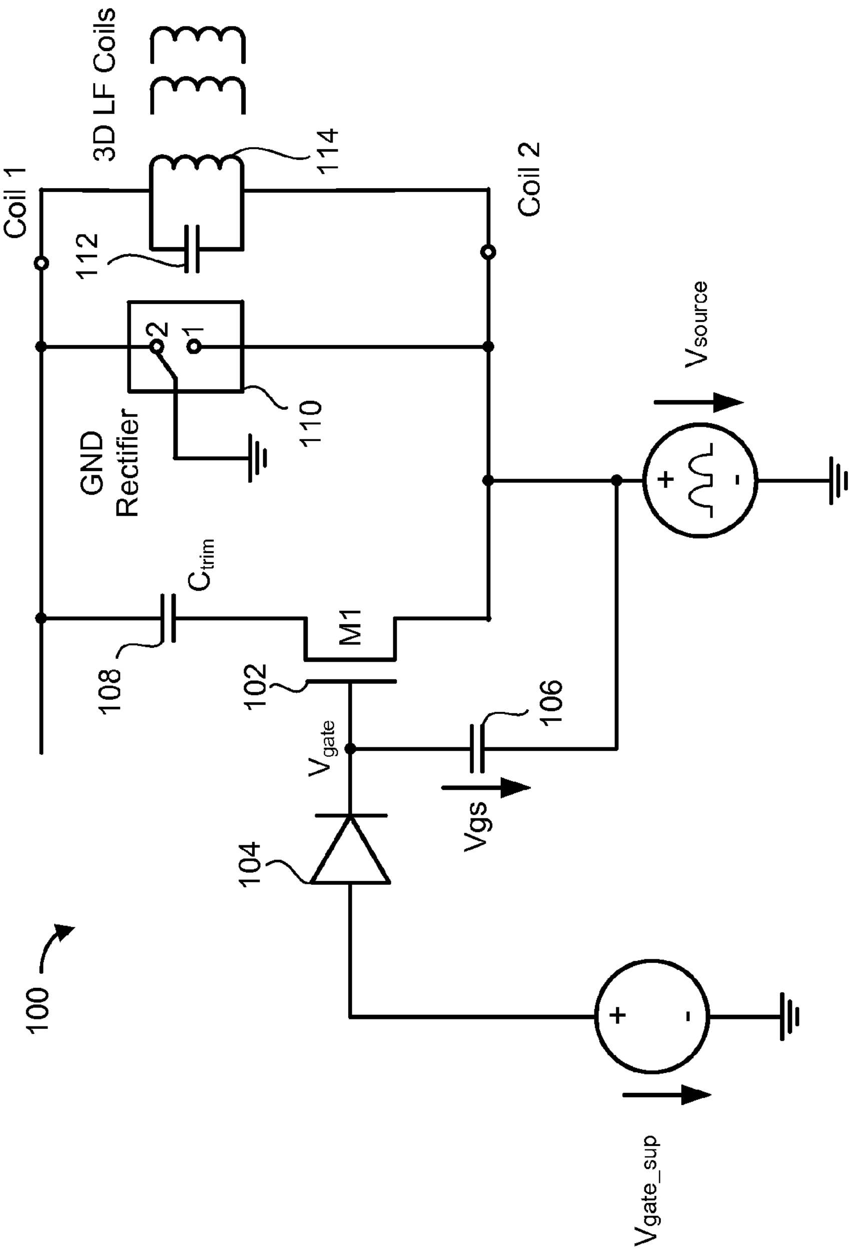
FIG. 1 is a block diagram of an example gate drive circuit.

FIG. 1 is a block diagram of an example gate drive circuit 100. Circuit 100 can be implemented in, for example, a key fob of an RKE application.

In some implementations, gate drive circuit 100 can include switching transistor 102 (M1), diode 104 (D1), gate capacitor 106 (C1), trim capacitor 108 (C2), ground (GND) rectifier 110, tuning capacitor 112 (C3) and LF coil 114 (L1). Although one gate driver circuit 100 and one coil 114 is shown in FIG. 1, one or more gate drive circuits can be used with one or more coils, such as three LF coils for three-dimensional (3D) coverage. Transistor 102 can be a MOS transistor (e.g., NMOS transistor). $V_{source}$ is fully rectified AC voltage waveform.

In the absence of diode 104 a high supply voltage $V_{gate\_sup}=V_{gs}+V_{source}$ (e.g., 13V for a 10V swing of $V_{source}$) is needed to turn on transistor 102. Generating such a high voltage can be problematic in designs with low supply voltage, such as a battery operated key fob. A voltage multiplier (e.g., charge pump) can be used to generate the high supply voltage. This approach, however, is not feasible in an extremely low power design because the voltage multiple needs a significant amount of current to function properly.

Referring to circuit 100, gate capacitor 106 gate is charged when $V_{source}$ drops below $V_{gate\_sup}-V_{diode}-V_{GS}$. The gate is charged to a voltage $V_{GS}$ that is high enough to turn on fully transistor 102. When $V_{source}$ goes up again, diode 104 prevents charge on the gate and gate capacitor 106 from discharging back into gate drive circuit 100. Thus, transistor 102 the source and drain terminals of transistor 102 may swing up to high voltages. The peak drain and source voltages are limited only by the breakdown voltages of transistor 102. In some implementations, small capacitors can be coupled in parallel to the gates of the transistors 102, 110 to reduce the impact of leakage currents of a gate drive circuit 100 and parasitic capacitors from the gate to GND.

Circuit 100 provides an advantage of zero current consumption. Another advantage is the fully differential connection of transistor 102 and trim capacitor 108 (or resistor) in parallel to coil 114. The topology does not change the performance of circuit 100. When transistor 102 is off, the gate is tied to GND by switch 110, which can be implemented using a MOS switch (e.g., NMOS transistor).

Figure 2:
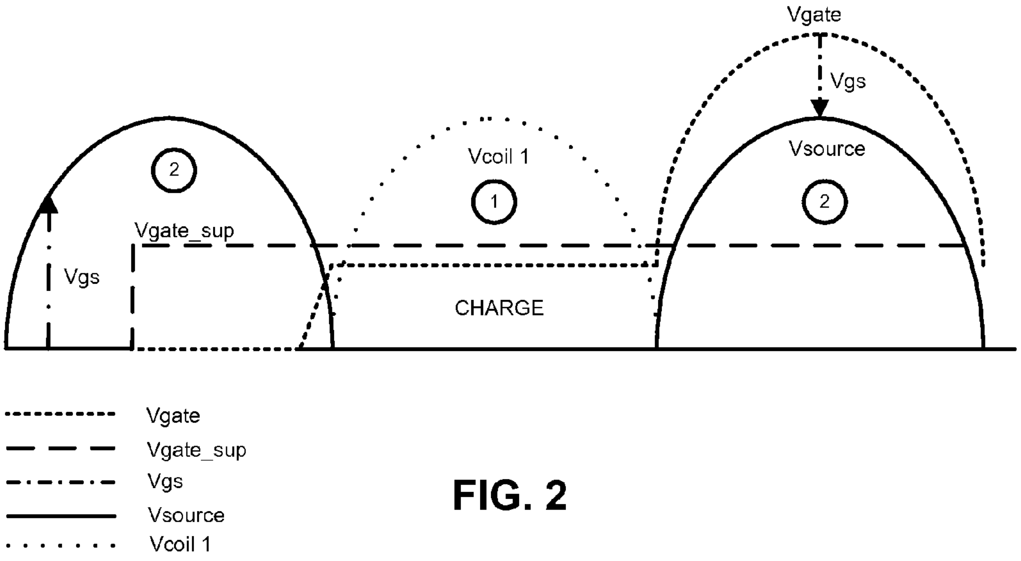
FIG. 2 illustrates a diagram illustrating operation of the gate drive circuit of FIG. 1.

FIG. 2 illustrates a diagram illustrating operation of the gate drive circuit of FIG. 1. As shown in FIG. 2 gate capacitor 106 is charged when $V_{source}$ drops below $V_{gate\_sup}-V_{diode}-V_{GS}$. The gate is charged to a voltage $V_{GS}$ that is high enough to turn on fully transistor 102. When $V_{source}$ goes up again, diode 104 prevents charge on the gate and gate capacitor 106 from discharging back into gate drive circuit 100

While this document contains many specific implementation details, these should not be construed as limitations on the scope what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

What is claimed is:

1. A circuit comprising:

a switching transistor having a gate, drain and source;

a coil coupled between the source and drain of the switching transistor;

a ground rectifier coupled in parallel with the coil; and a diode coupled between the gate of the switching transistor and a supply voltage.

2. The circuit of claim 1, where the ground rectifier includes a switch configured to couple opposite ends of the coil to ground.

3. The circuit of claim 1, further comprising:

a trim capacitor or resistor coupled to the drain of the switching transistor.

4. The circuit of claim 1, where the circuit is included in a key fob.

5. The circuit of claim 1, further comprising:

one or more capacitors coupled between the gate and a voltage source.

6. The circuit of claim 1, further comprising:

a tuning capacitor coupled in parallel to the coil.

7. The circuit of claim 5, where the voltage source is a fully rectified alternating current (AC) voltage waveform.

8. The circuit of claim 1, where the supply voltage is a battery.

* * * * *